US006577151B1

(12) United States Patent
Yang et al.

(10) Patent No.: US 6,577,151 B1
(45) Date of Patent: Jun. 10, 2003

(54) INSPECTION DEVICE FOR WIRING OF AN INTEGRATED CIRCUIT

(75) Inventors: Chon-Tsai Yang, Taipei (TW); Chen-Ping Su, Taipei (TW); Ming-Lang Tsai, Taipei (TW); Chia-Min Chuang, Taipei (TW)

(73) Assignee: Orient Semiconductor Electronics Limited, Kaohsiung (TW)

( * ) Notice: Subject to any disclaimer, the term of this patent is extended or adjusted under 35 U.S.C. 154(b) by 0 days.

(21) Appl. No.: 10/294,664

(22) Filed: Nov. 15, 2002

(30) Foreign Application Priority Data

Mar. 13, 2002 (TW) .................................... 91203115 U

(51) Int. Cl.[7] ............................................ G01R 31/26

(52) U.S. Cl. ....................... 324/765; 324/763; 324/764; 439/264

(58) Field of Search .............................. 324/555, 76.11, 324/763, 764, 765, 158.1; 439/65, 70, 263, 266, 268, 330, 331, 525, 541.5; 361/684, 785, 395, 796; 451/54, 289, 63; 140/147

(56) References Cited

U.S. PATENT DOCUMENTS 6,320,397 B1 * 11/2001 Wood et al. ................ 324/755
6,501,291 B1 * 12/2002 Shen .......................... 324/765

* cited by examiner

*Primary Examiner*—Kamand Cuneo
*Assistant Examiner*—Trung Q. Nguyen
(74) *Attorney, Agent, or Firm*—Leong C. Lei

(57) ABSTRACT

An inspection device for wiring of integrated circuit includes a base seat and an inspection cover, wherein the top end of the base seat is provided with cavity of appropriate depth and having supporting rib, and the two lateral sides of the cavity are provided with protruded edge a little higher than the cavity; the inspection cover having two side blocks is provided with an extended frame stripe such that the two side blocks and the two frame stripes are formed into a frame body, and corresponding stripes are formed between the two side blocks such that the corresponding stripes divides the frame body into a plurality of observation region, and each observation region is adapted for an inspection plate made from a transparent material, and the two side withholding seat of the inspection plate are located at the end face of the two side blocks, and the inspection plate moves along the end face of the two side blocks, whereby the base plate of the IC is positioned at the withholding protruded edge of the base seat and at the end face of the supporting stripe, then the inspection cap correspondingly covers the base seat and the inspection plate is used to inspect the height of arch of the wiring of the integrated circuit.

1 Claim, 9 Drawing Sheets

INSPECTION DEVICE FOR WIRING OF AN INTEGRATED CIRCUIT

BACKGROUND OF THE INVENTION (a) Technical Field of the Invention

The present invention relates to an inspection device for wiring of an integrated circuit, and in particular, an inspection device which can be easily fabricated and provides accuracy in inspection of ICs.

(b) Description of the Prior Art

Referring to FIG. 1, there is shown an integrated circuit 10 fixed to a base board 11 and a plurality of wires 12 connected the base board 11 to the integrated circuit 10 (IC). A plastic package is used to from into a plastic housing 13, thereby the IC connected to the base board 11 and provides its functions. Due to the sizes of the electronic appliances, the wiring 12 of an integrated circuit 10 may be exposed to the outer surface of the plastic housing 13 and become damaged. Therefore, it is a need to select the good wiring of the integrated circuit 10 prior to its application. Referring to FIGS. 2 and 3, the conventional inspection device comprises a seat body 20 and a top cover 30, and the top end face of the seat body 20 is provided with cavity 21 of an appropriate depth. The two lateral side of the cavity 21 are withholding protruded edge 22 and the two lateral sides of the end face on the seat body 20 is provided with a plurality of positioning pegs 23. The top cover 30 has a hollow region 31 which is corresponding to the cavity slot 21 of the end face of the seat body 20. The two interior sides of the hollow region 31 are provided with grooves 32 and the base edge of the top cover 30 is provided with a plurality of positioning holes 34 for the insertion of the positioning pegs 23 such that the seat body 20 and the top cover 30 are aligned and positioned. Therefore, the base board 11 of the IC 10 can be mounted to the withholding protruded edge 22 of the seat body 20 and the bade body circuit 10 is positioned within the cavity 21, and the top cover 30 is covered on to the end face of the seat body 20. At this instance, the inspection glass 33 can be removed to inspect whether the wiring 12 has contacted the inspection glass 33 so as to determine whether the wiring 12 is an acceptable or is rejected.

However, this conventional device has the following drawbacks:

(1) Due the close distance between the groove 32 and the bottom edge of the top cover 30, the fabrication of the top cover 30 is difficult and the size has to be very precise. Thus the cost of fabrication is high.

(2) As the base board 11 is positioned at the withholding protruded edge 22, if the base board 11 has a slight bend, the inspection result will be affected.

(3) The positioning holes 34 for insertion by the pegs 23 frequently cause misalignment and the peg 23 may be broken due to impact of the top cover 30.

(4) The inspection glass 33 cannot fully cover the base board 11 and the inspection of wiring 12 may wrongly contact the integrated circuit 10, causing damage to the products.

In view of the above, it is an object of the present invention to provide an inspection device for wiring of an integrated circuit, which can solve the above-mentioned drawbacks.

SUMMARY OF THE INVENTION

Accordingly, it is an object of the present invention to provide an inspection device for wiring of integrated circuit (IC), which is easily made and provides a better accuracy in inspection of ICs.

An aspect of the present invention is to provide an inspection device for wiring of integrated circuit comprising a base seat and an inspection cover, wherein the top end of the base seat is provided with cavity of appropriate depth and having supporting rib, and the two lateral sides of the cavity are provided with protruded edge a little higher than the cavity, the inspection cover having two side blocks is provided with an extended frame stripe such that the two side blocks and the two frame stripes are formed into a frame body, and corresponding stripes are formed between the two side blocks such that the corresponding stripes divides the frame body into a plurality of observation region, and each observation region is adapted for inspection plate made from a transparent material, and the two side withholding seat of the inspection plate are located at the end face of the two side blocks, and the inspection plate moves along the end face of the two side blocks, and by means of two side-sealing block, the lateral side of the inspection cover is fixed and the individual inspection plate is limited to the position such that the plate will not dislocate, and the two frame stripe of the inspection cover and the corresponding base edge are mounted with corresponding protruded edge which is corresponding to the withholding protruded edge of the base seat and the supporting ribs; thereby the base plate of the IC is positioned at the withholding protruded edge of the base seat and at the end face of the supporting stripe, then the inspection cap correspondingly covers the base seat and the inspection plate is used to inspect the height of arch of the wiring of the integrated circuit.

The foregoing object and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

DETAILED DESCRIPTION OF THE PREFERRED EMBODIMENT

The following descriptions are of exemplary embodiments only, and are not intended to limit the scope, applicability or configuration of the invention in any way. Rather, the following description provides a convenient illustration for implementing exemplary embodiments of the invention. Various changes to the described embodiments maybe made in the function and arrangement of the elements described without departing from the scope of the invention as set forth in the appended claims.

Figure 1:
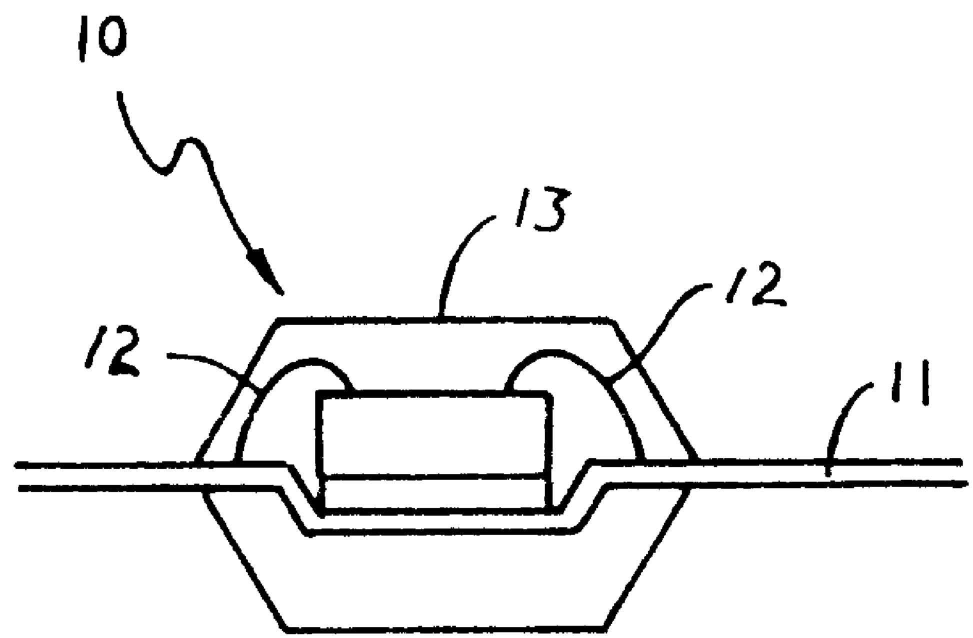
FIG. 1 is a schematic view of a conventional integrated circuit (IC).
Figure 2:
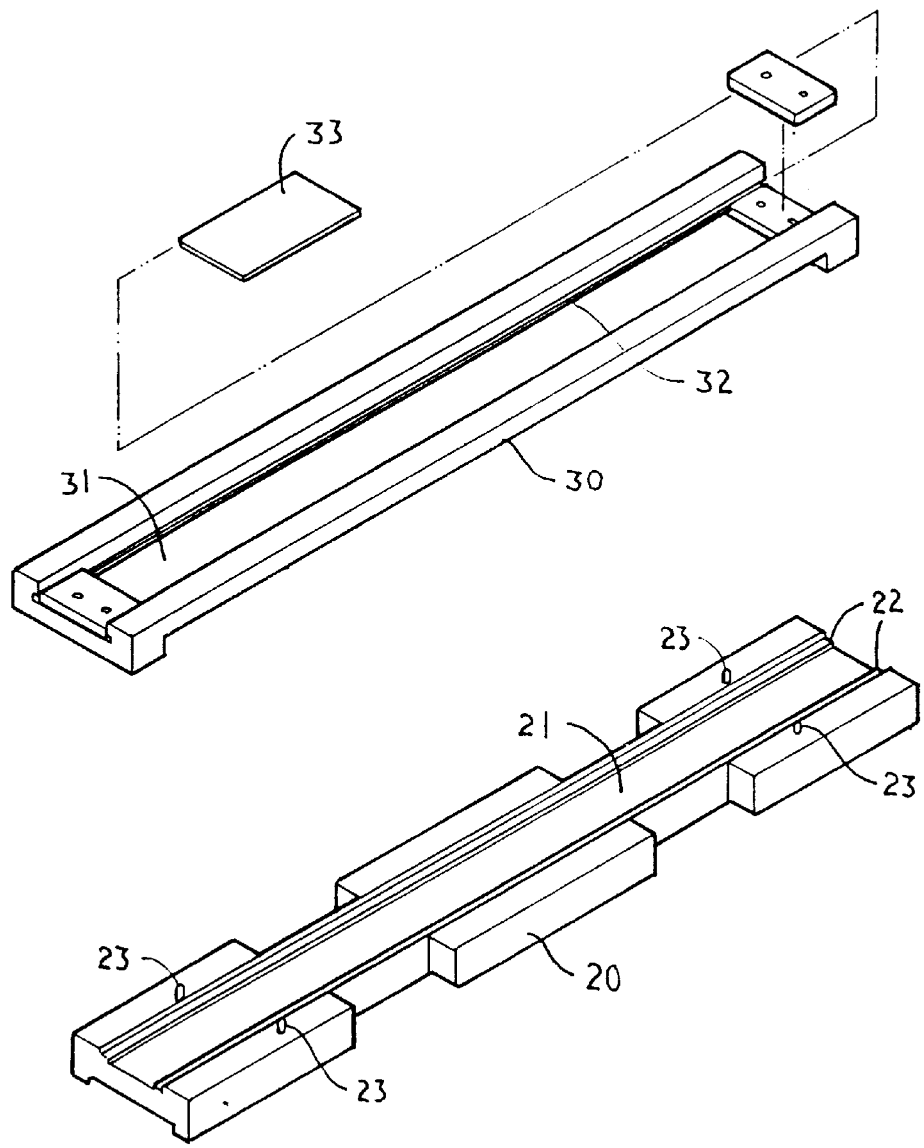
FIG. 2 is a perspective view of a conventional inspection device.
Figure 3:
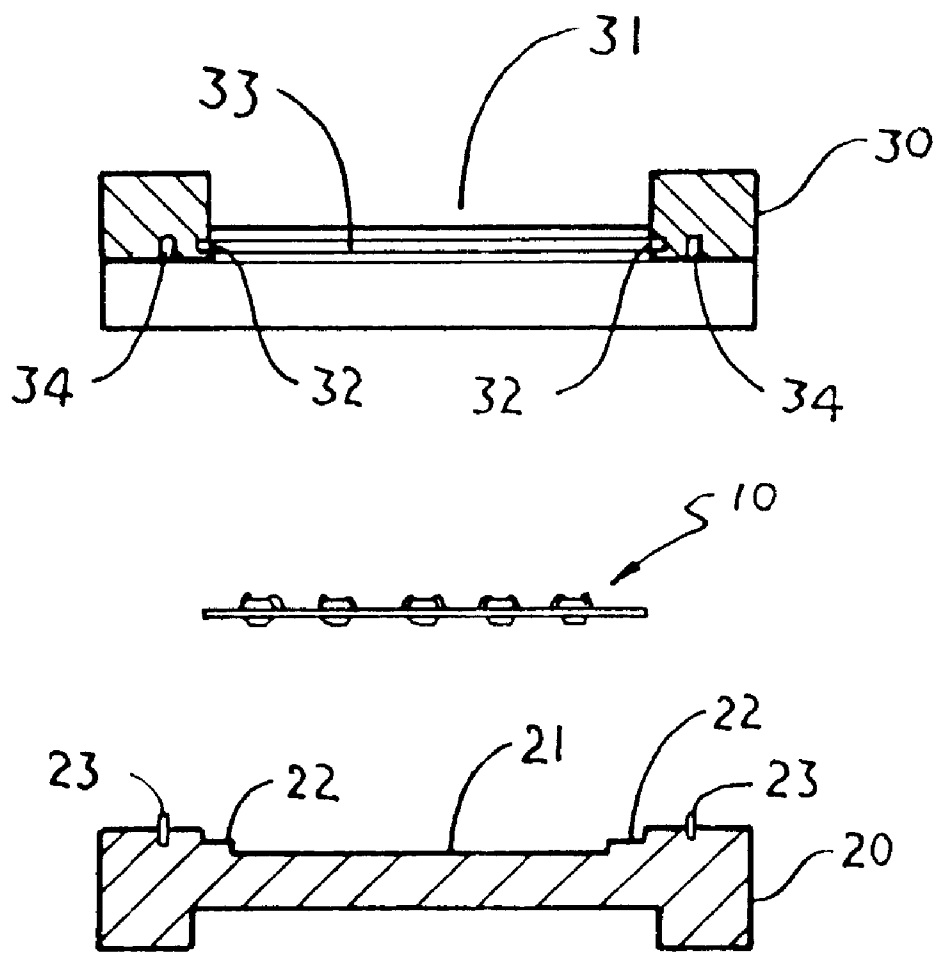
FIG. 3 is a sectional view of a conventional inspection device.
Figure 4:
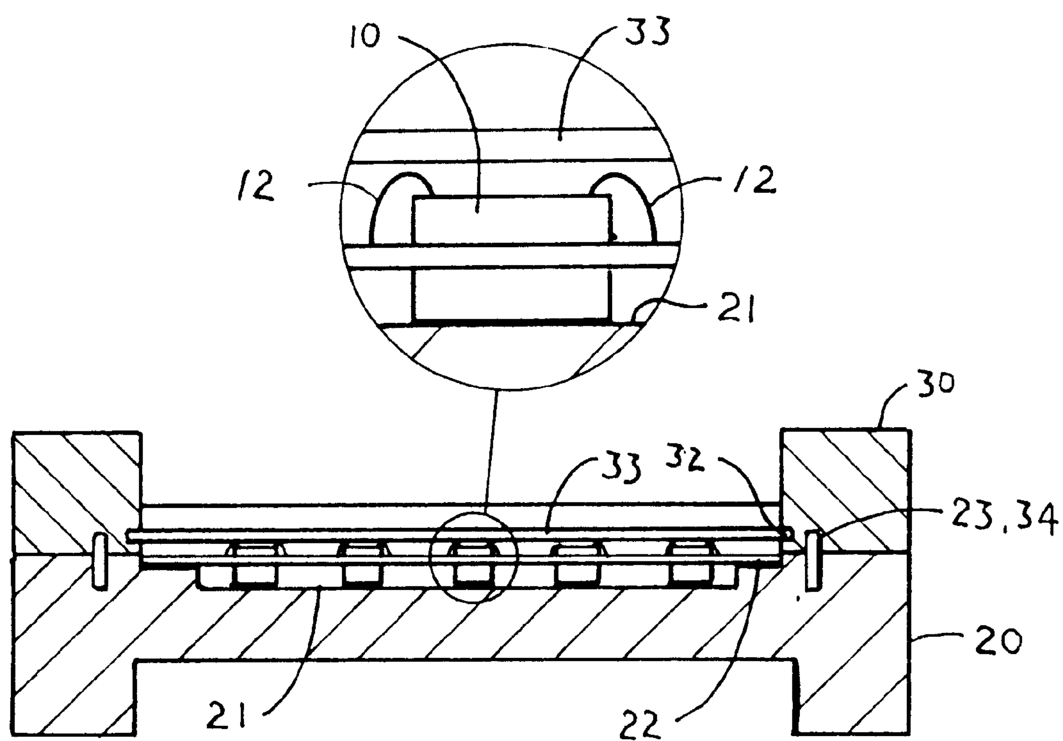
FIG. 4 is a schematic view of a conventional inspection device.
Figure 5:
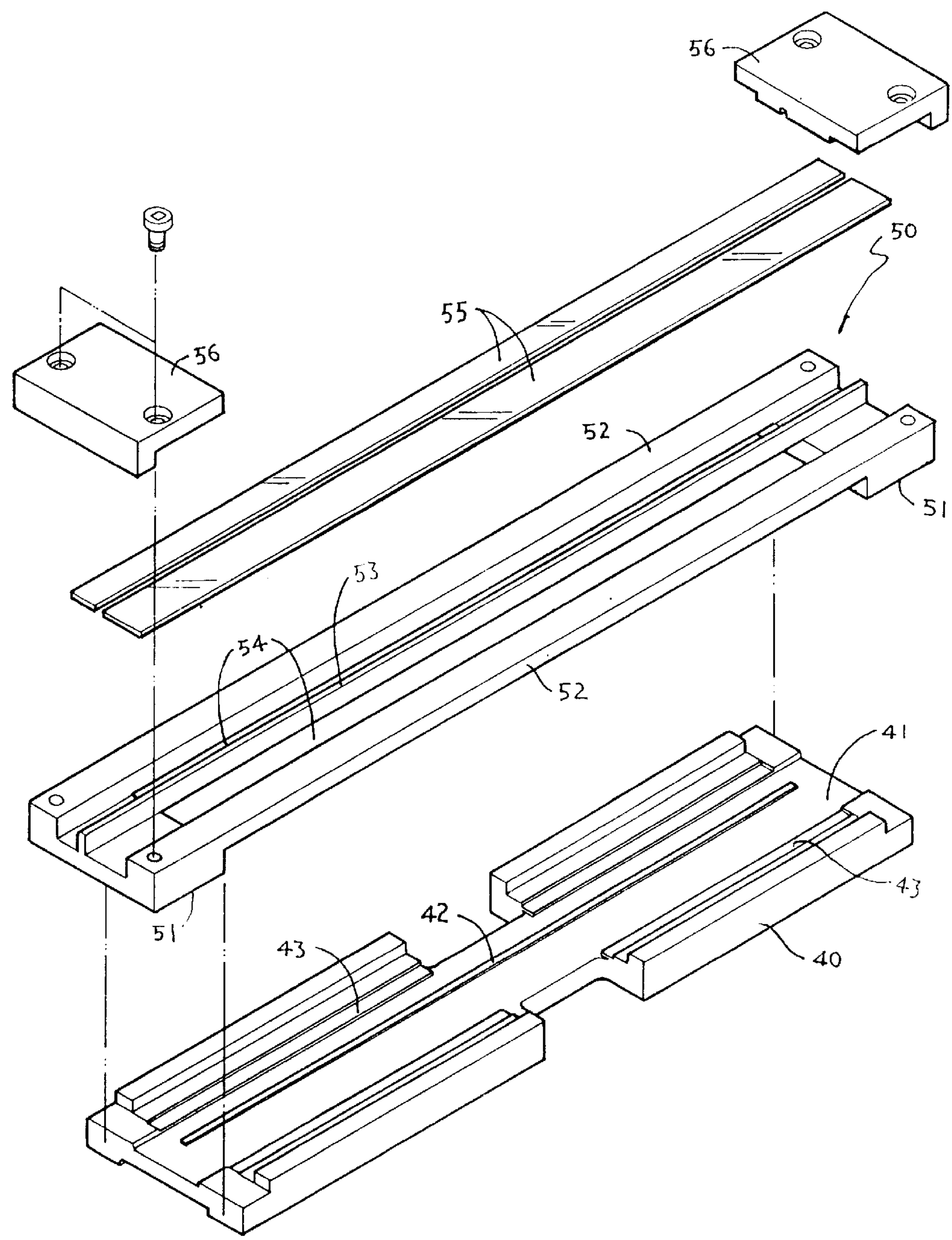
FIG. 5 is a perspective view of the inspection device in accordance with the present invention.

In accordance with the present invention, the present inspection device comprises a base seat 40 and an inspection cover 50. As shown in FIG. 5, the top end face of the base seat 40 has a cavity 41 with an appropriate depth and the cavity 41 is provided with more or more tan one supporting ribs 42. The two lateral sides of the cavity 41 is provided with withholding protruded edge 43 a little higher than the depth of the cavity 41.

Figure 6:
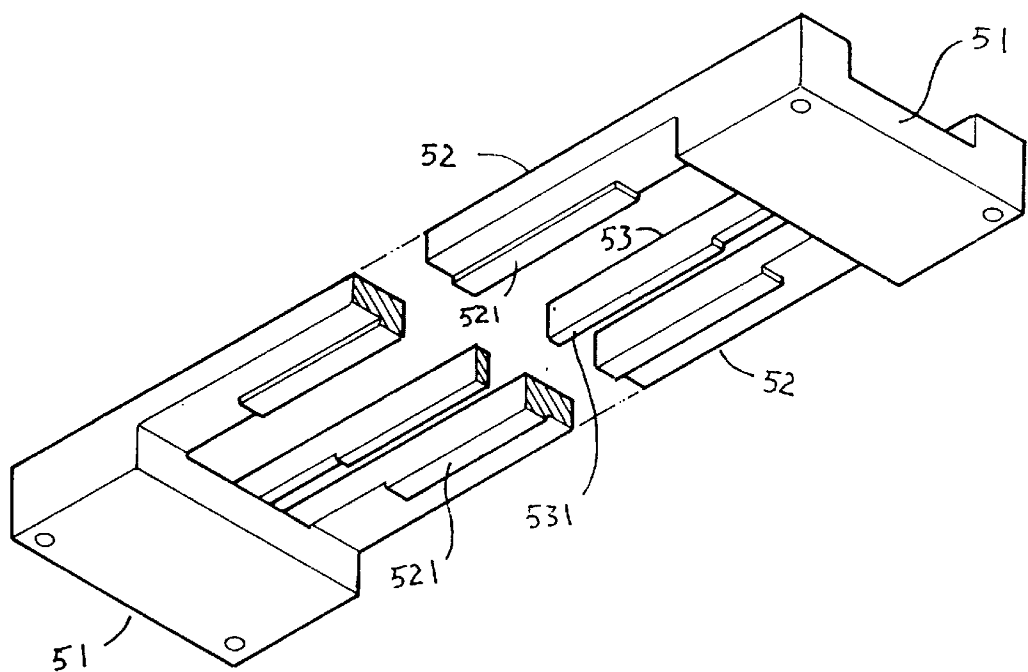
FIG. 6 is another perspective view of the inspection device in accordance with the present invention.

Referring to FIGS. 5 and 6, the inspection cover 50 is having two side blocks 51 which is provided with an extended frame stripe 52 such that the two side blocks 51 and the two fame stripes 52 are formed into a frame body, and corresponding stripes 53 are formed between the two side blocks 51 such that the corresponding stripes 53 divides the frame body into a plurality of observation region 54, and each observation region 54 is adapted for inspection plate 55 made from a transparent material, and the two side withholding seat of the inspection plate 55 are located at the end face of the two side blocks 51, and the inspection plate 55 moves along the end face of the two side blocks 51, and by means of two side-sealing block 56, the lateral side of the inspection cover 50 is fixed and the individual inspection plate 55 is limited to the position such that the plate 55 will not be dislocated, and the two frame stripes 52 of the inspection cover 50 and the corresponding base edge 43 are mounted with corresponding.protruded edge 521, 531 which are corresponding to the withholding protruded edge 43 of the base seat 40 and the supporting ribs 42; thereby the base plate 61 of the IC is positioned at the withholding protruded edge 43 of the base seat 40 and at the end face of the supporting ribs 42, then the inspection cover 50 correspondingly covers the base seat 40 and the inspection plate 55 is used to inspect the height of arch of the wiring of the integrated circuit.

Figure 7:
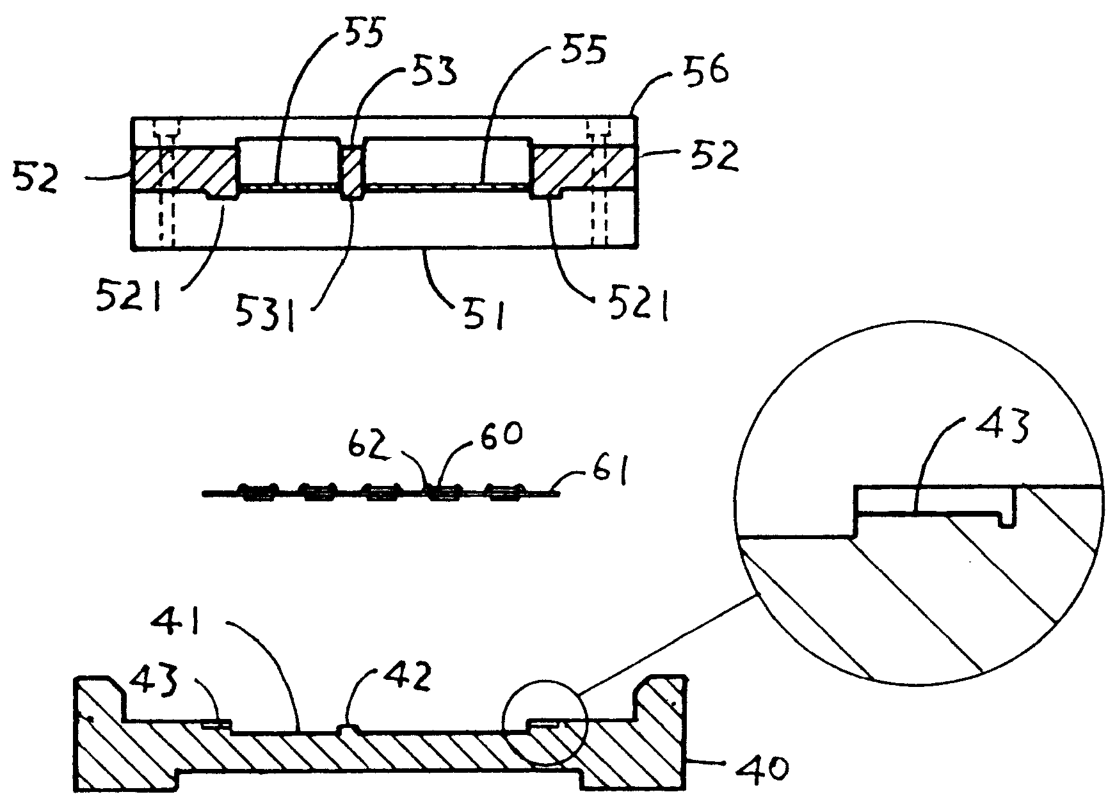
FIG. 7 is an exploded sectional view of the inspection device in accordance with the present invention.
Figure 8:
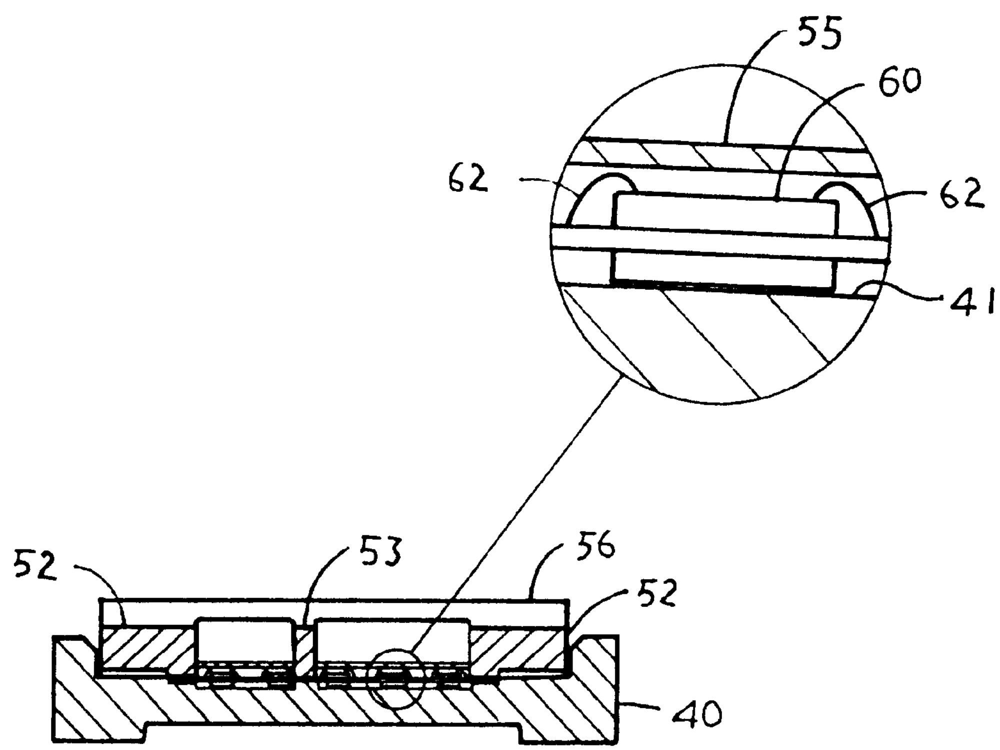
FIG. 8 is a schematic view of the inspection device in accordance with the present invention.

As shown in FIGS. 7 and 8, the base plate 61 of the IC 60 is positioned at the withholding protruded edge and the end face of the supporting ribs 42, and the IC 60 can be exactly away form the cavity 41. The inspection cover 50 covers the end face of the base seat 40 such that the two side blocks 51 of the inspection cover 50 are exactly located at the two side ends of the base seat 4o and to position the two components, and the corresponding protruded edges 521, 531, are respectively positioned at the withholding protruded edge 43 and the supporting rib 42. Thus the base plate 61 is clipped and becomes balance. At this instance, the inspection plate 55 can be observed or slightly moves away the inspection plate 55, the wiring whether has contacted the inspection plate 55 can be inspected and the wiring 62 whether is acceptable can be determined.

The present inspection device has the following advantages:

(1) The fabrication of the base seat 40 or the inspection cover 50 are of certain thickness which enable fabrication, and therefore the cost of manufacturing of the components can be reduced.

(2) The base plate 61 is located at the withholding protruded edge 42 which provides a balanced clipping of the base plate 61, therefore, a better inspection result can be obtained.

(3) The two side blocks 51 can be positioned at the side ends of the base seat 40, avoiding the conventional drawback of peg breakage.

Figure 9:
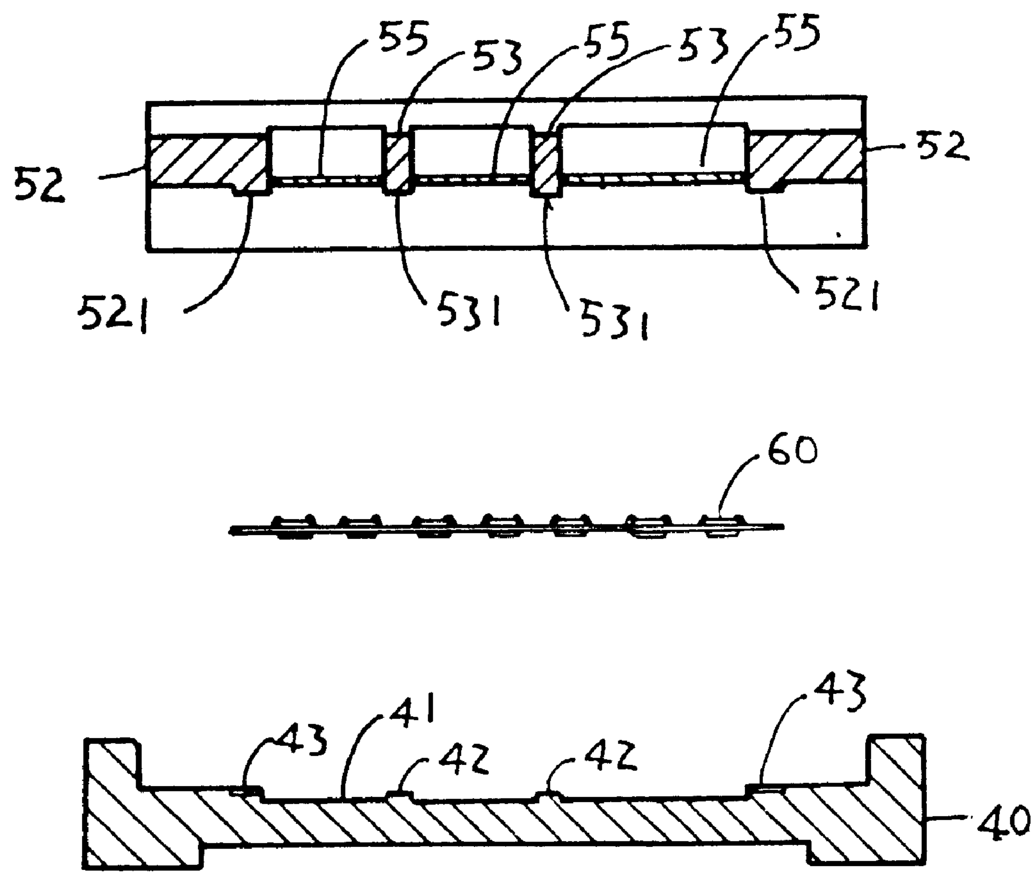
FIG. 9 is an exploded sectional view of another preferred embodiment of the inspection device in accordance with the present invention.

In accordance with the present invention, the supporting rib 42 and the corresponding stripe 53 of the inspection cover 50 can have the configuration as shown in FIG. 5, it can be as that shown in FIG. 9 where the area of the base plate 61 is mounted with two or more than two corresponding stripes so as to provide sufficient support for withholding base plate 61 to provide an accurate inspection environment so as to obtain excellent quality of the inspection of wiring of integrated circuits.

It will be understood that each of the elements described above, or two or more together may also find a useful application in other types of methods differing from the type described above.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention.

We claim:

1. An inspection device for wiring of integrated circuit comprising a base seat and an inspection cover, wherein the top end of the base seat is provided with cavity of appropriate depth and having supporting rib, and the two lateral sides of the cavity are provided with protruded edge a little higher than the cavity; the inspection cover having two side blocks is provided with an extended frame stripe such that the two side blocks and the two frame stripes are formed into a frame body, and corresponding stripes are formed between the two side blocks such that the corresponding stripes divides the frame body into a plurality of observation region, and each observation region is adapted for inspection plate made from a transparent material, and the two side withholding seat of the inspection plate are located at the end face of the two side blocks, and the inspection plate moves along the end face of the two side blocks, and by means of two side-sealing block, the lateral side of the inspection cover is fixed and the individual inspection plate is limited to the position such that the plate will not dislocate, and the two frame stripe of the inspection cover and the corresponding base edge are mounted with corresponding protruded edge which is corresponding to the withholding protruded edge of the base seat and the supporting ribs; thereby the base plate of the IC is positioned at the withholding protruded edge of the base seat and at the end face of the supporting stripe, then the inspection cap correspondingly covers the base seat and the inspection plate is used to inspect the height of arch of the wiring of the integrated circuit.

* * * * *